United States Patent
Ohashi (10) Patent No.: US 11,363,751 B2
(45) Date of Patent: Jun. 14, 2022

(54) MOUNTING ORDER DETERMINATION DEVICE, MOUNTING ORDER EXAMINATION DEVICE, MOUNTING ORDER DETERMINATION METHOD, AND MOUNTING ORDER EXAMINATION METHOD

(71) Applicant: FUJI CORPORATION, Chiryu (JP)

(72) Inventor: Teruyuki Ohashi, Anjo (JP)

(73) Assignee: FUJI CORPORATION, Chiryu (JP)

( * ) Notice: Subject to any disclaimer, the term of this patent is extended or adjusted under 35 U.S.C. 154(b) by 301 days.

(21) Appl. No.: 16/614,669

(22) PCT Filed: May 23, 2017

(86) PCT No.: PCT/JP2017/019194
§ 371 (c)(1),
(2) Date: Nov. 18, 2019

(87) PCT Pub. No.: WO2018/216101
PCT Pub. Date: Nov. 29, 2018

(65) Prior Publication Data
US 2020/0170156 A1 May 28, 2020

(51) Int. Cl.
*H05K 13/08* (2006.01)
*G05B 19/418* (2006.01)
*H05K 13/04* (2006.01)

(52) U.S. Cl.
CPC ... *H05K 13/0882* (2018.08); *G05B 19/41865* (2013.01); *G05B 2219/36195* (2013.01);
(Continued)

(58) Field of Classification Search
CPC .......... H05K 13/0882; H05K 13/0409; G05B 19/41865
(Continued)

(56) References Cited

U.S. PATENT DOCUMENTS

| 2004/0073322 A1 | 4/2004 | Maenishi et al. |
| 2006/0047353 A1 | 3/2006 | Maenishi et al. |

(Continued)

FOREIGN PATENT DOCUMENTS

| JP | 2001-77597 A | 3/2001 |
| JP | 2003-31997 A | 1/2003 |

(Continued)

OTHER PUBLICATIONS

Extended European Search Report dated Apr. 20, 2020, in Patent Application No. 17910571.3, citing documents AA-AB therein, 10 pages.

(Continued)

*Primary Examiner* — Robert A Cassity
(74) *Attorney, Agent, or Firm* — Oblon, McClelland, Maier & Neustadt, L.L.P.

(57) ABSTRACT

A mounting order determination device for determining a mounting order of multiple electronic components prior to mounting work using a component mounting machine or a component mounting line, the mounting order determination device including a level setting section for setting level information, in which mounting order priorities are ranked, for each component type, the target of which being of at least one of a multilayer mounting component type group, including a component type of multiple electronic components having a possibility of being mounted in the up-down direction in layers, and a close-proximity mounting component type group.

8 Claims, 7 Drawing Sheets (52) U.S. Cl.
CPC ....... *H05K 13/041* (2018.08); *H05K 13/0409* (2018.08); *H05K 13/0812* (2018.08)

(58) Field of Classification Search
USPC .......................................................... 700/101
See application file for complete search history.

(56) References Cited

U.S. PATENT DOCUMENTS

| | | | | |
|---|---|---|---|---|
| 2006/0052893 | A1* | 3/2006 | Yamazaki | H05K 13/085 700/100 |
| 2008/0154392 | A1* | 6/2008 | Maenishi | H05K 13/0853 700/32 |
| 2008/0228304 | A1* | 9/2008 | Maenishi | G05B 19/41865 700/108 |
| 2008/0262642 | A1* | 10/2008 | Maenishi | H05K 13/085 700/99 |
| 2009/0024242 | A1* | 1/2009 | Mimura | H01L 21/67132 700/114 |
| 2016/0037693 | A1* | 2/2016 | Kurashina | H05K 13/085 29/739 |
| 2016/0255755 | A1* | 9/2016 | Iisaka | H05K 13/0882 29/739 |
| 2018/0376635 | A1* | 12/2018 | Iisaka | H05K 13/085 |

FOREIGN PATENT DOCUMENTS

| | | |
|---|---|---|
| JP | 2004-87874 A | 3/2004 |
| JP | 2006-229244 A | 8/2006 |
| JP | 2007-129129 A | 5/2007 |
| JP | 2013-187295 A | 9/2013 |
| JP | 2014-27064 A | 2/2014 |
| JP | 2014-96401 A | 5/2014 |

OTHER PUBLICATIONS

International Search Report dated Jul. 25, 2017 in PCT/JP2017/019194 filed May 23, 2017.

* cited by examiner

| Component type | PA | PB | PC | PD | PE |
|---|---|---|---|---|---|
| Level information | 2 | 4 | 1 | 3 | 5 |

| Component type | PB | PC | PD |
|---|---|---|---|
| Height dimension | 小(HB) | 中(HC) | 大(HD) |
| Level information | 11 | 12 | 13 |

MOUNTING ORDER DETERMINATION DEVICE, MOUNTING ORDER EXAMINATION DEVICE, MOUNTING ORDER DETERMINATION METHOD, AND MOUNTING ORDER EXAMINATION METHOD

TECHNICAL FIELD

The present specification relates to a component mounting machine and a component mounting line for mounting an electronic component (hereinafter referred to as a component) on a board, and more particularly, to determination and examination of a mounting order for multiple components.

BACKGROUND ART

Techniques for mass producing circuit boards by carrying out various operations for mounting components on printed wiring boards (hereinafter referred to as board work) have become widespread. Examples of board work machines for carrying out board work include a solder printing machine, a component mounting machine, a reflow machine, and a board examination machine. These board work machines are generally connected to form a board work line. Further, in many cases, multiple component mounting machines are arranged in a row to constitute a component mounting line. A component mounting machine generally includes a board conveyance device, a component supply device, and a component transfer device.

Among boards on which a component mounting machine performs mounting work, there are boards with multilayer mounted structures in which multiple components are stacked in the up-down direction. When producing a board having multilayer mountings, the component mounting machine first mounts the lower components among the multilayer mountings, and then mounts the upper components. That is, the mounting order of multiple components to be multilayer mounted is restricted. Technical examples relating to this type of multilayer mounting are disclosed in Patent Literature 1 and 2.

The component mounting machine of Patent Literature 1 includes a storage means, a relative position changing means, and a control means. The storage means stores, for each mounting order, information on the horizontal position on the board on which the components are mounted, information on the height of the components already mounted, and information on the thickness of the components. The relative position changing means changes the relative positions of the extracting nozzle and the board. The control means controls the relative positions of the horizontal direction and the height direction based on the three pieces of stored information. With this, the component can be reliably mounted even if the height at which the component is mounted is not constant. In other words, upper components can be mounted even if an error occurs in the height of a component that is a lower component within the multiple mountings.

Patent Literature 2 discloses a component mounting machine in which components are stacked and mounted (i.e., multilayer mounting is performed) on a board. The component mounting machine includes a storage section for three-dimensional coordinate data indicating the mounting position of a component with an XY coordinate value and multiple mounting reference heights of components to be stacked with Z-coordinate values, a transfer means for stacking components, and a control means for controlling the operation of the transfer means based on the three-dimensional coordinate data. With this, electronic components are stacked and mounted on a board by using three-dimensional coordinate data.

PATENT LITERATURE

Patent Literature 1: JP-A-2006-229244
Patent Literature 2: JP-A-2007-129129

BRIEF SUMMARY

Technical Problem

In Patent Literature 1 and 2, multilayer mounting is performed based on a predetermined mounting order of multiple components, but CAD data indicating the component arrangement for each board type is generally two-dimensional data. Therefore, although it is possible to determine which multiple components are to be multilayer mounted on the basis of the CAD data, it is not possible to determine the vertical relationship, that is, the mounting order of the multiple components. For this reason, conventionally, the operator has to individually set the mounting order for each type of board for multiple components to be multilayer mounted, which is cumbersome for the operator.

In recent years, high-density mounting of components has been promoted in response to demand for miniaturizing boards. In high-density mounting, the mounting positions of multiple components are close to each other, thereby restricting the mounting order. In this case, if a large-sized component having a large height dimension is mounted first, when a small-sized component having a small height dimension is mounted in close proximity thereafter, the mounted large-sized component interferes and thereby hinders the mounting work. Therefore, in the prior art, also in the case of multiple components being mounted close to each other, the operator has to individually set the mounting order for each board type, which is labor-intensive.

Further, the mounting order of multiple components corresponding to multilayer mountings or close-proximity mountings has to be set in advance in job data defining the details of the mounting work. However, a part of the job data may be modified due to a partial design change of the board, a model change of a component, a production defect, or the like. In such a case, the mounting order in the modified job data may be unsuitable. Therefore, there is a need to check whether a predetermined mounting order is correct.

An object of the present disclosure to provide a mounting order determination device and a mounting order determination method that reduce the workload of individually setting the mounting order, for each board type, of multiple components applied in at least one of multilayer mounting and close-proximity mounting. Another object of the present disclosure is to provide a mounting order determination device and a mounting order examination method for automatically checking whether a predetermined mounting order is correct for multiple components applied in at least one of multilayer mounting and close-proximity mounting.

Solution to Problem

The present specification discloses a mounting order determination device configured to determine a mounting order of multiple electronic components prior to mounting work of mounting multiple electronic components at respective mounting positions on a board by using a component mounting machine or a component mounting line configured by arranging multiple component mounting machines in a row, the mounting order determination device comprising: a level setting section configured to set level information, in which mounting order priorities are ranked, for each component type, the target of which being of at least one of a multilayer mounting component type group that includes a component type of multiple electronic components having a possibility of being mounted in the up-down direction in layers, and a close-proximity mounting component type group that includes a component type of multiple electronic components for which the mounting order is restricted due to having a possibility of being mounted close to each other; a component extracting section configured to extract a combination of multiple electronic components to which at least one of multilayer mounting and close-proximity mounting is applied, based on dimensions and mounting positions of the multiple electronic components; and an order determination section configured to determine the mounting order of the electronic components in the combination based on the level information set for the component types of the electronic components included in the combination.

The present specification further discloses a mounting order examination device configured to examine a mounting order, set in advance, of multiple electronic components prior to mounting work of mounting multiple electronic components at respective mounting positions on a board by using a component mounting machine or a component mounting line configured by arranging multiple component mounting machines in a row, the mounting order examination device comprising: a level setting section configured to set level information, in which mounting order priorities are ranked, for each component type, the target of which is at least one of a multilayer mounting component type group, including a component type of multiple electronic components having a possibility of being mounted in an up-down direction in layers, and a close-proximity mounting component type group that includes a component type of multiple electronic components for which the mounting order is restricted due to having a possibility of being mounted close to each other; a component extracting section configured to extract a combination of multiple electronic components to which at least one of multilayer mounting and close-proximity mounting is applied, based on dimensions and mounting positions of the multiple electronic components; an order determination section configured to determine the mounting order of the electronic components in the combination based on the level information set for the component types of the electronic components included in the combination; and an order examination section configured to perform an examination by comparing the mounting order set in advance with the correct mounting order.

The present specification further discloses a mounting order determination method for determining a mounting order of multiple electronic components prior to mounting work of mounting multiple electronic components at respective mounting positions on a board by using a component mounting machine or a component mounting line configured by arranging multiple component mounting machines in a row, the mounting order determination method comprising: setting level information, in which mounting order priorities are ranked, for each component type, the target of the setting process being at least one of a multilayer mounting component type group that includes a component type of multiple electronic components having a possibility of being mounted in an up-down direction in layers, and a close-proximity mounting component type group that includes a component type of multiple electronic components for which the mounting order is restricted due to having a possibility of being mounted close to each other; extracting a combination of multiple electronic components to which at least one of multilayer mounting and close-proximity mounting is applied, based on dimensions and mounting positions of the multiple electronic components; and determining the mounting order of the electronic components in the combination based on the level information set for the component types of the electronic components included in the combination.

The present specification further discloses a mounting order examination method for examining a mounting order, set in advance, of multiple electronic components prior to mounting work of mounting multiple electronic components at respective mounting positions on a board by using a component mounting machine or a component mounting line configured by arranging multiple component mounting machines in a row, the mounting order examination method comprising: setting level information, in which mounting order priorities are ranked, for each component type, the target of which is at least one of a multilayer mounting component type group that includes a component type of multiple electronic components having a possibility of being mounted in an up-down direction in layers, and a close-proximity mounting component type group that includes a component type of multiple electronic components for which the mounting order is restricted due to having a possibility of being mounted close to each other; extracting a combination of multiple electronic components to which at least one of multilayer mounting and close-proximity mounting is applied, based on dimensions and mounting positions of the multiple electronic components; determining the mounting order of the electronic components in the combination based on the level information set for the component types of the electronic components included in the combination; and performing an examination by comparing the mounting order set in advance with the correct mounting order.

Advantageous Effects

With the mounting order determination device and the mounting order determination method disclosed in this specification, level information, in which mounting order priorities are ranked, is set for each component type for component type groups capable of being multilayer mounted or close-proximity mounted. A correct mounting order for the combination of electronic components to which at least one of multilayer mounting and close-proximity mounting is applied is automatically determined based on the level information. Therefore, the workload required for the operator to individually set the mounting order for each board type is reduced.

Further, with the mounting order examination device and the mounting order examination method disclosed in this specification, when examining the mounting order set in advance for multiple electronic components, level information, in which mounting order priorities are ranked, is set in advance for each component type for component type groups capable of being multilayer mounted or close-proximity mounted. A correct mounting order for the combination of electronic components, to which at least one of multilayer mounting and close-proximity mounting is applied, is automatically determined based on the level information. Therefore, whether the set mounting order is correct compared with the correct mounting order is automatically examined.

DESCRIPTION OF EMBODIMENTS

1. Configuration of Component Mounting Machine 1

Figure 1:
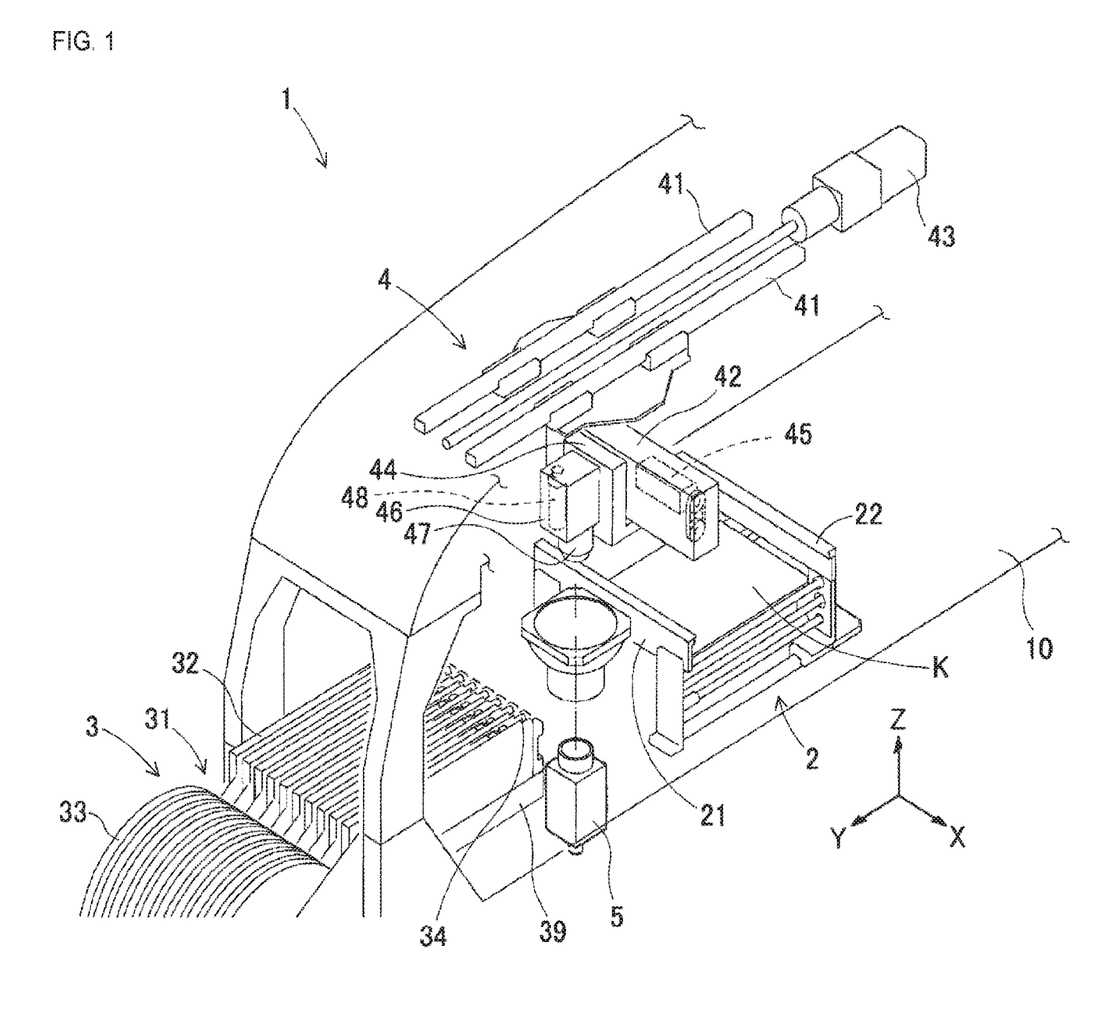
FIG. 1 A perspective view of the main portion of a component mounting machine which is a target of a mounting order determination device of a first embodiment.

First, component mounting machine 1, which is a target of mounting order determination device 7 of a first embodiment, will be described as an example. FIG. 1 is a perspective view of the main portion of component mounting machine 1, which is a target of mounting order determination device 7 according to the first embodiment. The direction from the upper left to the lower right in FIG. 1 is the X-axis direction for conveying board K, and the direction from the upper right to the lower left is the Y-axis direction which is the front-rear direction of component mounting machine 1. Component mounting machine 1 includes board conveyance device 2, component supply device 3, component transfer device 4, part camera 5, control section 6 (refer to FIG. 2), and device table 10. The target of mounting order determination device 7 may be a component mounting line configured by arranging multiple component mounting machines 1 in a row.

Board conveyance device 2 includes first guide rail 21 and second guide rail 22, a pair of conveyor belts, a clamping device, and the like. First guide rail 21 and second guide rail 22 extend in the X-axis direction across the center of the upper portion of device table 10, and are assembled to device table 10 so as to be parallel to each other. A pair of conveyor belts arranged parallel to each other are arranged in parallel immediately below first guide rail 21 and second guide rail 22. The pair of conveyor belts rotate while board K is placed on the conveyor conveyance surface and carry board K into and out of the mounting position set in the center portion of device table 10. In addition, a clamping device is provided below the conveyor belt in the center portion of device table 10. The clamping device pushes up board K with multiple push-up pins, clamps board K in a horizontal orientation, and positions board K at the mounting execution position.

Component supply device 3 is detachably mounted at the front of component mounting machine 1. Component supply device 3 includes device pallet 39, multiple feeder devices 31, and the like. Device pallet 39 is a thin rectangular box-like member. Multiple slots extending in parallel in the Y-axis direction are engraved in the upper face of device pallet 39. The multiple feeder devices 31 are detachably inserted and attached to individual slots.

Feeder device 31 includes main body 32, supply reel 33 provided on the front of main body 32, and component pickup section 34 provided on the upper portion at the rear end of main body 32. A carrier tape in which a large number of components are sealed at a predetermined pitch is wound and held on supply reel 33. When the carrier tape is fed out at a predetermined pitch, components are released from an encapsulated state and sequentially fed into component pickup section 34. A tray-type device (not shown) can be attached to component supply device 3 in place of a portion of feed devices 31. Tray-type devices supply relatively large components by using trays that hold multiple components.

Component transfer device 4 includes a pair of Y-axis rails 41, Y-axis moving table 42, Y-axis motor 43, X-axis moving table 44, an X-axis motor 45, mounting head 46, rotary tool 47, Z-axis motor 48, and the like. The pair of Y-axis rails 41 are disposed from the rear of device table 10 to a region above component supply device 3 in the front. Y-axis moving table 42 is loaded on the pair of Y-axis rails 41. Y-axis moving table 42 is driven by Y-axis motor 43 via a ball screw mechanism and moves in the Y-axis direction. X-axis moving table 44 is loaded on Y-axis moving table 42. X-axis moving table 44 is driven from X-axis motor 45 via a ball screw mechanism and moves in the X-axis direction.

Mounting head 46 is disposed on the front of X-axis moving table 44. Mounting head 46 has rotary tool 47 on its lower side. Although not shown in FIG. 1, multiple suction nozzles are annularly arranged on the underside of rotary tool 47. The multiple suction nozzles are rotated under rotary tool 47 to select one suction nozzle. The selected suction nozzle is moved up and down by Z-axis motor 48. The suction nozzle picks up a component by being supplied with negative pressure and mounts the component to board K by being supplied with positive pressure. Without being limited thereto, mounting head 46 may have a clamping type mounting tool for clamping a component.

Component transfer device 4 repeats the pickup-mounting cycle to progress with mounting work. Describing the pickup-mounting cycle in more detail, mounting head 46 of component transfer device 4 moves to component supply device 3 and picks up components with multiple suction nozzles. Next, when mounting head 46 moves to part camera 5, the holding state of multiple components is imaged. Next, mounting head 46 moves to board K to mount multiple components and returns to component supply device 3 again.

Part camera 5 is provided facing upward on the upper face of device table 10 between board conveyance device 2 and component supply device 3. Part camera 5 captures an image of a state in which multiple suction nozzles of mounting head 46, after picking up components at component pickup section 34, are in the middle of moving to board K. As a result, part camera 5 can collectively image the components held by multiple suction nozzles. The acquired image data is subjected to image processing, and the suction state of the components is confirmed. Upon checking the component suction position, rotation angle deviation, bending of leads, and the like, the mounting operation is finely adjusted as necessary. Components that are difficult to mount are discarded.

Control section 6 retains job data for each board type and controls the mounting work. The job data is data describing detailed procedures and methods such as the mounting order of components in the mounting work. Control section 6 transmits various commands to board conveyance device 2, component supply device 3, component transfer device 4, and part camera 5. In addition, control section 6 receives information on the operational state and the like from these devices.

2. Mounting Order Determination Device 7 of First Embodiment

Figure 2:
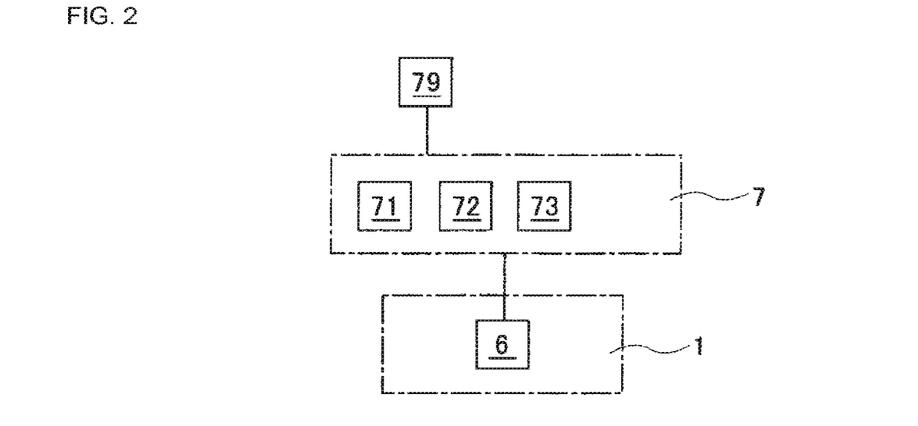
FIG. 2 A block diagram showing the functional configuration of the mounting order determination device of the first embodiment.

Next, mounting order determination device 7 of the first embodiment will be described. Mounting order determination device 7 determines the mounting order of multiple components prior to a mounting operation which uses component mounting machine 1 or a component mounting line. FIG. 2 is a block diagram showing a functional configuration of mounting order determination device 7 according to the first embodiment. Mounting order determination device 7 is configured with a computer device. Mounting order determination device 7 is connected to control section 6 of component mounting machine 1.

Mounting order determination device 7 is connected to CAD database 79 storing CAD data for each board type. The CAD data includes mounting position information indicating the arrangement of components on board K. The CAD data is linked to a component database (not shown) in which information such as dimensions and electrical characteristic values of each component is accumulated. Mounting order determination device 7 creates the job data described above based on the CAD data. Mounting order determination device 7 includes three functional sections that function when job data is created, namely, level setting section 71, component extracting section 72, and order determination section 73.

Figure 3:
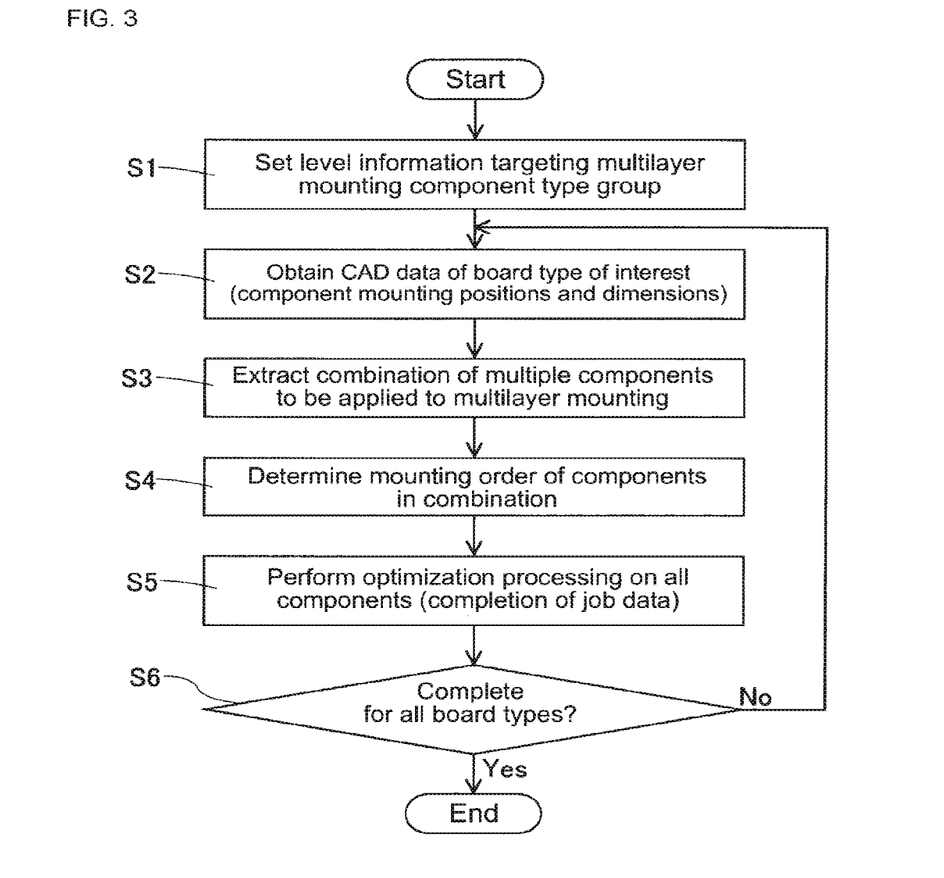
FIG. 3 A flow chart showing the operational flow of the mounting order determination device of the first embodiment.

FIG. 3 is a flow chart showing the operational flow of mounting order determination device 7 according to the first embodiment. In step S1 of FIG. 3, level setting section 71 sets level information, in which mounting order priorities are ranked, for each component type, the target of which is the multilayer mounting component type group. The multilayer mounting component type group includes component types of multiple components having a possibility of being mounted in the up-down direction in layers. Examples of component types belonging to the multilayer mounting component type group include CPU component PA, small chip component PB, chip component PC, memory component PD, and shield component PE.

Figure 4:
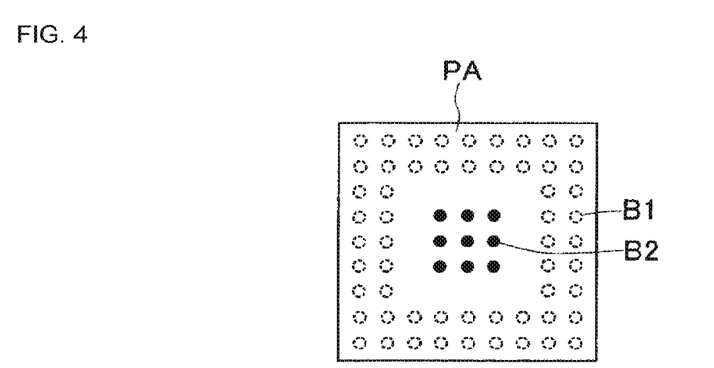
FIG. 4 A plan view of a CPU component.

FIG. 4 is a plan view of CPU component PA. CPU component PA is a square component in plan view. CPU component PA has 56 ball grid B1 connected to a board in the peripheral portion of the bottom face. CPU component PA further has nine ball grid B2 in the center portion of the upper face to which memory component PD can be connected as required. That is, CPU component PA may be used alone or may be used with memory component PD mounted on the upper face.

Figure 5:
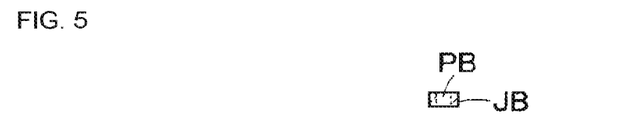
FIG. 5 A plan view of a small chip component.
Figure 6:
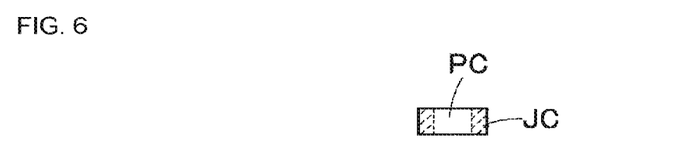
FIG. 6 A plan view of the chip component.

FIG. 5 is a plan view of small chip component PB. Small chip component PB is a small rectangular component in plan view. Small chip component PB has two connecting sections JB at the short sides of the bottom face. FIG. 6 is a plan view of chip component PC. Chip component PC is a rectangular component having a length, a width, and a height which are approximately twice as long as small chip component PB. Chip component PC has two connecting sections JC at the short sides of the bottom surface.

Figure 7:
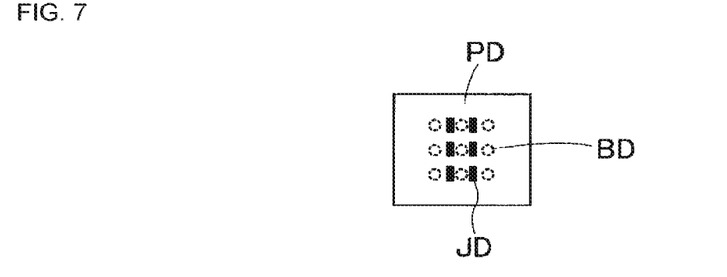
FIG. 7 A plan view of a memory component.
Figure 8:
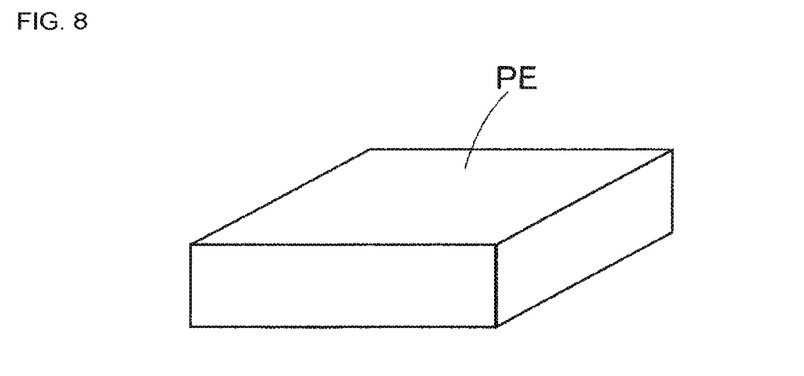
FIG. 8 A view showing a shield component.

FIG. 7 is a plan view of memory component PD. Memory component PD is a square component having a side length less than half that of CPU component PA. Memory component PD has nine ball grid BD connected to CPU component PA on its bottom face. Memory component PD further has three pairs of connecting sections JD on the upper face to which three small chip components PB can be connected as required. FIG. 8 is a view showing shield component PE.

Shield component PE is a square box-shaped component with the length of one side about twice as long as memory component PD and is opened downward. Shield component PE is formed using an electromagnetic shielding material such as iron and shields at least one of an electric field and a magnetic field.

With the five component types described above as targets, level setting section 71 sets low-number levels to component types having the possibility of being mounted on the lower side of the multilayer mounting. Furthermore, level setting section 71 sets high-number levels to component types having the possibility of being mounted on the upper side of the multilayer mounting. Level setting section 71 may automatically set the level information with reference to the performance record for each component type. Alternatively, level setting section 71 may store level information manually set by the operator. Whether each component type is in the upper side or the lower side of the multilayer mounting can be determined based on the circuit configuration of board K, the structure and function of the component type, and the like, even if there is no performance record.

Figure 9:
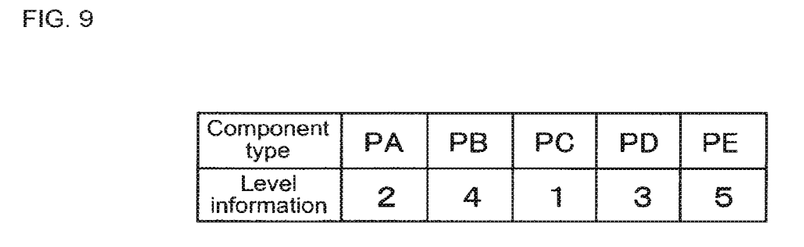
FIG. 9 A table showing level information set for the five components.

FIG. 9 is a table showing level information set for the five component types. In the example of FIG. 9, a second level is set to CPU component PA, and a fourth level is set to small chip component PB. In addition, a first level is set to chip component PC, a third level is set to memory component PD, and a fifth level is set to shield component PE. In fact, a large number of levels may be set for even larger numbers of component types. The levels do not necessarily have to be consecutive. In addition, the same level may be set to multiple component types.

Even if the board type of board K to be produced is sequentially added, the level set to each component type does not change in principle. However, it is also possible to modify the set level information by referring to the mounting order of the newly added board type.

Returning to step S2 of FIG. 3, component extracting section 72 obtains CAD data from CAD database 79 by focusing on the type of board on which multilayer mounting is performed. In other words, component extracting section 72 acquires information on the mounting position of the component to be mounted on the target board type from CAD database 79. Further, component extracting section 72 obtains information on the dimensions of the component to be mounted from the component database.

In the next step, step S3, component extracting section 72 extracts a combination of multiple components to be applied to the multilayer mounting based on mounting positions and dimensions of the components. More specifically, component extracting section 72 determines the range of the component on the board K in consideration of the vertical dimension and the horizontal dimension of the component at the mounting position where the center of the component is located. When at least a part of the ranges occupied by the multiple components overlap each other, component extracting section 72 determines that a multiple mounting is to be performed and extracts a combination of multiple components to be applied to the mounting. It should be noted that the present disclosure is not limited to double mounting, and mounting of three or more layers is possible.

In the next step, step S4, order determination section 73 determines the mounting order of the components in the combination based on level information set for the component type of the components included in the extracted combination. The mounting order determination by order determination section 73 is intended to limit the precedence within combinations, and does not mean that mounting is performed in succession.

Figure 10:
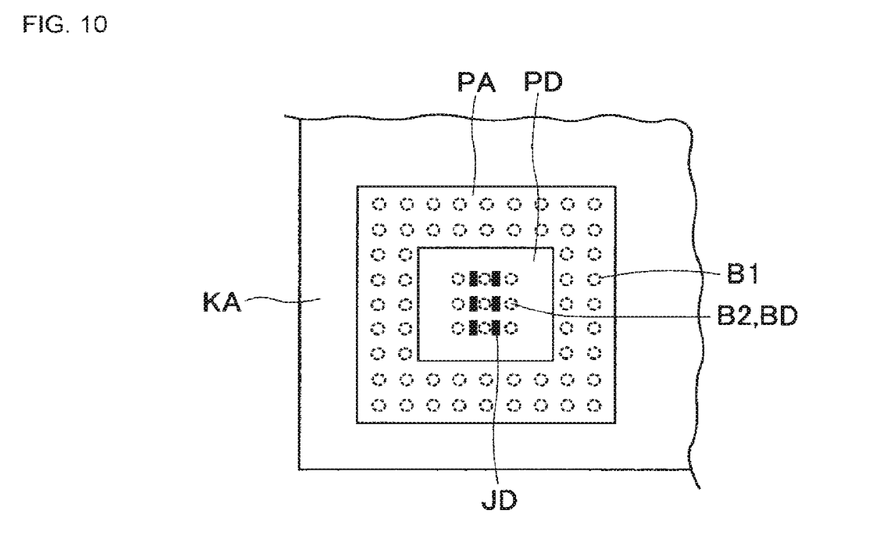
FIG. 10 A plan view showing a multilayer mounted state of boards of board type A.
Figure 11:
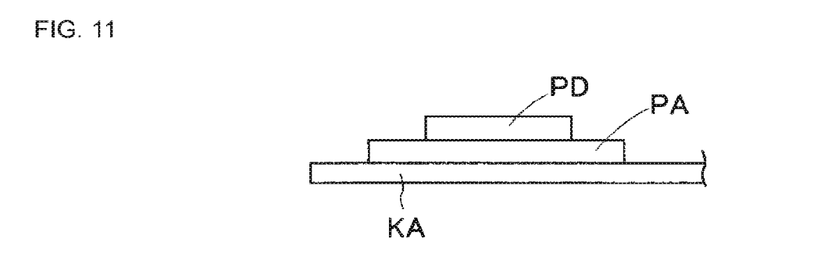
FIG. 11 A side view of the multilayer mounted state of FIG. 10.

For example, FIG. 10 is a plan view showing a multilayer mounted state of board KA of board type A. FIG. 11 is a view of the multilayer mounted state of FIG. 10 as viewed from the side. In the actual mounting order of the multilayer mounting shown in the figure, first, CPU component PA is mounted on the upper face of board KA. Next, memory component PD is mounted on the upper face of CPU component PA.

Component extracting section 72 extracts a combination of CPU component PA and memory component PD to be applied to the multilayer mounting. Order determination section 73 determines the mounting order in order of ascending level based on the second level set for CPU component PA and the third level set for memory component PD. That is, order determination section 73 determines that the mounting operation of CPU component PA is first, and the mounting operation of memory component PD is later. The determined mounting order corresponds to the actual mounting order. If the sequence of CPU component PA and memory component PD is not reversed, the mounting operations of other components may be performed in the meantime.

Figure 12:
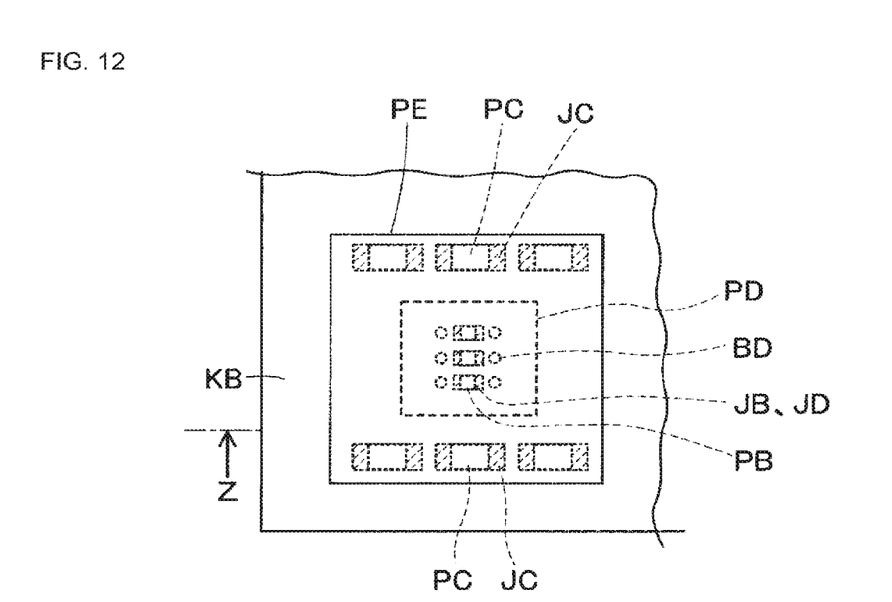
FIG. 12 A plan view showing a multilayer mounted state of boards of board type B.
Figure 13:
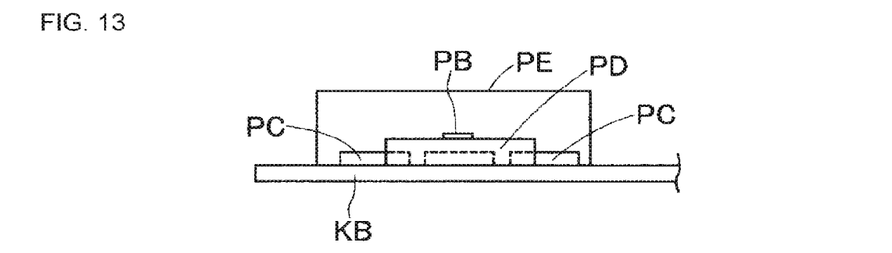
FIG. 13 A side cross-sectional view of the multilayer mounted state of FIG. 12 from the Z-direction.

Further, for example, FIG. 12 is a plan view showing a multilayer mounting state of board KB of board type B. FIG. 13 is a side cross-sectional view of the multilayer mounting state of FIG. 12 as viewed from the Z-direction. In the actual mounting order of the multilayer mounting shown in the figure, first, six chip components PC and memory components PD are mounted on the upper face of board KB. Next, three small chip components PB are mounted on the upper face of memory component PD. Finally, shield component PE is mounted on board KB so as to cover the six chip components PC, the memory component PD, and the three small chip components PB.

Component extracting section 72 extracts the combination of three small chip components PB, six chip components PC, memory component PD, and shield component PE corresponding to the multilayer mounting. Order determination section 73 determines the levels for the mounting order in ascending order. That is, order determination section 73 determines the mounting order of, first, chip component PC (first level); second, memory component PD (third level); third, small chip component PB (fourth level); and fourth, shield component PE (fifth level). The determined mounting order corresponds to the actual mounting order. Note that, if attention is paid only to chip component PC and memory component PD for which multilayer mounting is not performed, it is possible to switch the mounting order. Also, during the mounting of these component types, mounting work for other components may be performed.

Returning to step S5 of FIG. 3, mounting order determination device 7 performs an optimization process on all components mounted on board K to complete the job data. At this time, the mounting order of the multilayer mounting portions determined by order determination section 73 is treated as a necessary condition of the optimization process. In the next step, step S6, mounting order determination device 7 determines whether the optimization processes for all board types having multilayer mounting have been completed. If the processes have not been completed yet, mounting order determination device 7 changes the board type and returns to step S2 in the execution of the operational flow.

The loop from step S2 to step S6 is repeated for all board types having multilayer mountings. Mounting order determination device 7 performs only the optimization process of step S6 for board types that have neither multilayer mountings nor close-proximity mountings (to be described in detail later). When the optimization process for all board types is completed, mounting order determination device 7 ends the operational flow. Thereafter, mounting order determination device 7 transmits the job data of the next board type to be produced to control section 6. As a result, component mounting machine 1 is ready to perform mounting work again. Mounting order determination device 7 may perform steps S2 to S6 each time the type of a board to be produced is determined.

In step S1, mounting order determination device 7 of the first embodiment sets in advance the level information, in which mounting order priorities are ranked, for each component type, the target of mounting order determination device 7 being the component type group capable of being multilayer mounted. Further, mounting order determination device 7 executes steps S2 to S4 for each board type having multilayer mounting. As a result, a correct mounting order is automatically determined based on level information for combinations of components to which multilayer mounting is applied. Therefore, the workload required for the operator to individually set the mounting order for each board type is reduced.

3. Mounting Order Examination Device 7A of Second Embodiment

Figure 14:
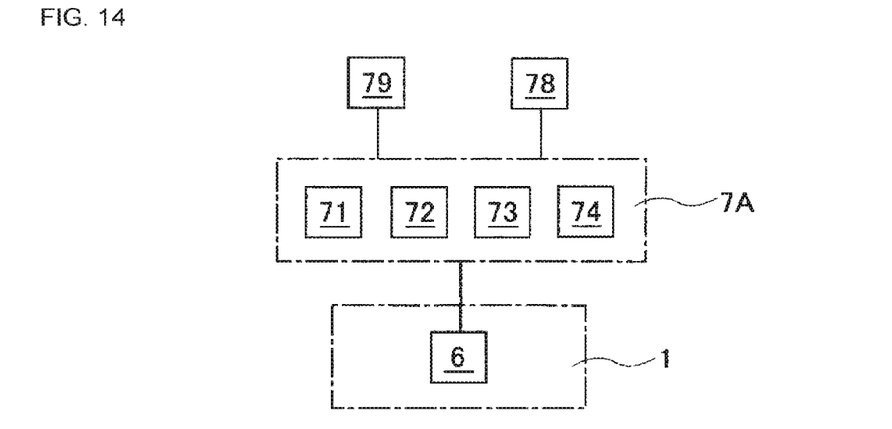
FIG. 14 A block diagram showing a functional configuration of a mounting order examination device of a second embodiment.

Next, mounting order examination device 7A of a second embodiment will be described with reference to FIG. 14, mainly on the points which differ from mounting order determination device 7 of the first embodiment. Mounting order examination device 7A checks the mounting order set in advance for multiple components prior to mounting work using component mounting machine 1 or a component mounting line. FIG. 14 is a block diagram showing a functional configuration of a mounting order examination device 7A according to the second embodiment.

In addition to CAD database 79, mounting order examination device 7A is also connected to job database 78. Job database 78 stores job data created for each board type of board K. Mounting order examination device 7A acquires job data for each board type from job database 78. In these job data, the mounting order of multiple components to be multilayer mounted is set in advance. Given that the job data can be changed, the job data takes into account the possibility that the mounting order may become unsuitable due to a change. Therefore, it is necessary to check whether a predetermined mounting order is correct before mounting work is started in component mounting machine 1.

Mounting order examination device 7A includes order examination section 74 in addition to level setting section 71, component extracting section 72, and order determination section 73. Level setting section 71, component extracting section 72, and order determination section 73 operate in the same manner as in the first embodiment. However, order determination section 73 can determine the correct mounting order for mounting multilayer components. Order examination section 74 performs an examination by comparing the mounting order set in advance in job data with the correct mounting order determined by order determination section 73. In this way, whether the set mounting order is correct is automatically examined.

4. Mounting Order Determination Device 7B of Third Embodiment

Figure 15:
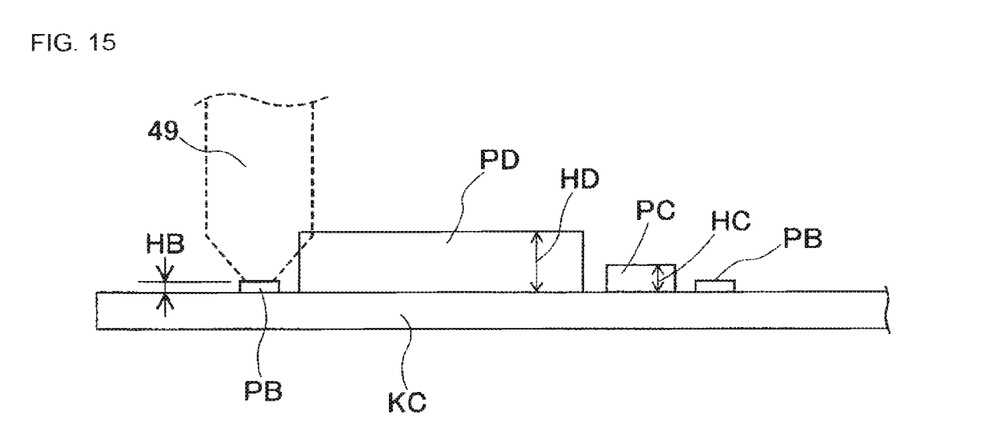
FIG. 15 A side view of a board of board type C for schematically describing a close-proximity mounting component type group.

Next, mounting order determination device 7B of a third embodiment will be described with reference to FIGS. 15 to 17, mainly on the points which differ from the first and second embodiments. Mounting order determination device 7B according to the third embodiment targets a close-proximity mounting component type group. FIG. 15 is a side view of board KC of board type C for schematically describing a close-proximity mounting component type group. In the example of FIG. 15, small chip component PB, chip component PC, and memory component PD constitute the close-proximity mounting component type group.

In particular, as high-density mounting of components progresses, the mounting positions of multiple components become close to each other, thereby restricting the mounting order. Assume that, from the close-proximity mounting component type group, memory component PD having large height HD is mounted first. In this case, when small chip component PB having small height HB is mounted thereafter, suction nozzle 49 picking up small chip component PB and memory component PD interfere with each other.

Similarly, suction nozzle 49 which picks up chip component PC, having intermediate height HC, and mounted memory component PD may interfere with each other. Further, suction nozzle 49, which picks up small chip component PB, and mounted chip component PC may interfere with each other. Mounting order determination device 7B of the third embodiment reliably avoids these interferences.

Figure 16:
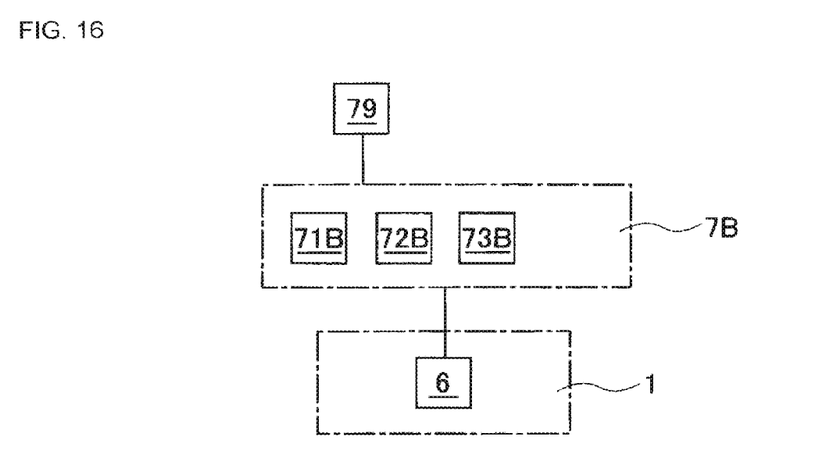
FIG. 16 A block diagram showing a functional configuration of a mounting order determination device of a third embodiment.

FIG. 16 is a block diagram showing a functional configuration of mounting order determination device 7B of a third embodiment. Level setting section 71B, component extracting section 72B, and order determination section 73B of mounting order determination device 7B exhibit functions differing from those of the first embodiment. More specifically, for multiple components that may be mounted close to each other, level setting section 71B sets a low-number level to small chip component PB having small height HB. Further, level setting section 71B sets an intermediate-number level to intermediate-size chip component PC having intermediate height HC, and sets a high-number level to memory component PD having large height HD. FIG. 17 is a table showing an example listing of level information set for the three component types.

Figure 17:
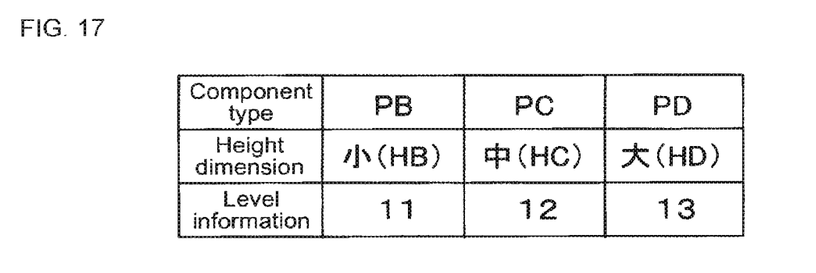
FIG. 17 A table showing an example listing of level information set for the three component types.

In the example of FIG. 17, the eleventh level is set to small chip component PB, the twelfth level is set to chip component PC, and the thirteenth level is set to memory component PD. As can be seen from comparing FIG. 17 and FIG. 9, the order of the levels is different between the first embodiment and the third embodiment. That is, while the components of the first embodiment are arranged in the order of chip component PC, memory component PD, and small chip component PB, in the third embodiment, the components are arranged in the order of small chip component PB, chip component PC, and memory component PD.

Component extracting section 72B extracts a combination of multiple components to which close-proximity mounting is applied. Order determination section 73B determines the levels for the mounting order in ascending order for component types of the components included in the combination. That is, component extracting section 72B determines the order as, first, small chip component PB; second, chip component PC; and third, memory component PD. As a result, the mounting work is performed in order of decreasing height (HB, HC, HD) for the close-proximity mounting component type group, and the above-described interference does not occur.

5. Mounting Order Determination Device 7C of Fourth Embodiment

Next, with reference to FIG. 9, FIG. 17, and FIG. 18, mounting order determination device 7C of a fourth embodiment will be described mainly with respect to points that are different from the first to third embodiments. In the fourth embodiment, component mounting device 1 is produced by switching board KA of board type A, board KB of board type B, and board KC of board type C. At the time of switching the board type, a setup change operation is performed as appropriate. Board type A and board type B are included in a first group of board types with multilayer mountings. Board type C is included in a second group of board types having close-proximity mountings. Mounting order determination device 7C according to a fourth embodiment uses level information for the first group and the second group of board types.

Figure 18:
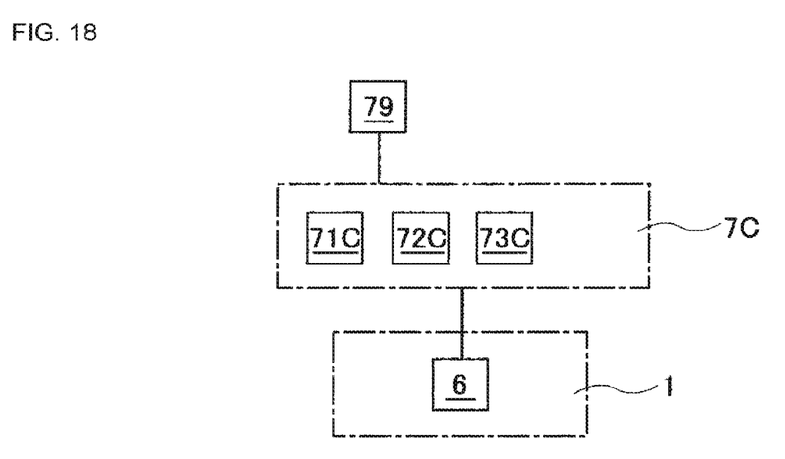
FIG. 18 A block diagram showing a functional configuration of a mounting order determination device of a fourth embodiment.

FIG. 18 is a block diagram showing a functional configuration of mounting order determination device 7C of a fourth embodiment. Level setting section 71C, component extracting section 72C, and order determination section 73C of mounting order determination device 7C exhibit functions differing from those of the first and third embodiments. More specifically, level setting section 71C sets first level information to be applied to the first group of board types, and further sets second level information to be applied to the second group of board types. The first level information matches the level information of the five component types shown in FIG. 9. The second level information matches the level information of the three component types shown in FIG. 17. The orders of the first level information and the second level information are different from each other.

For the first group of board types, component extracting section 72C extracts a combination of multiple components to which multilayer mounting is applied. Further, for the second group of board types, component extracting section 72C extracts a combination of multiple components to which close-proximity mounting is applied. Order determination section 73C selectively uses the first level information and the second level information in accordance with the type of board K to be mounted. More specifically, order determination section 73C uses the first level information when job data of board type A and board type B, which are the first group of board types, is generated. Order determination section 73C uses the second level information when job data of board type C, which is the board type of the second group, is generated.

With this, even if there is a combination of components in which the mounting order is switched depending on the board type, the first level information and the second level information are selectively used according to the group of the board type. Therefore, mounting order determination device 7C can determine the correct mounting order for all board types.

6. Mounting Order Determination Device 7D of Fifth Embodiment

Figure 19:
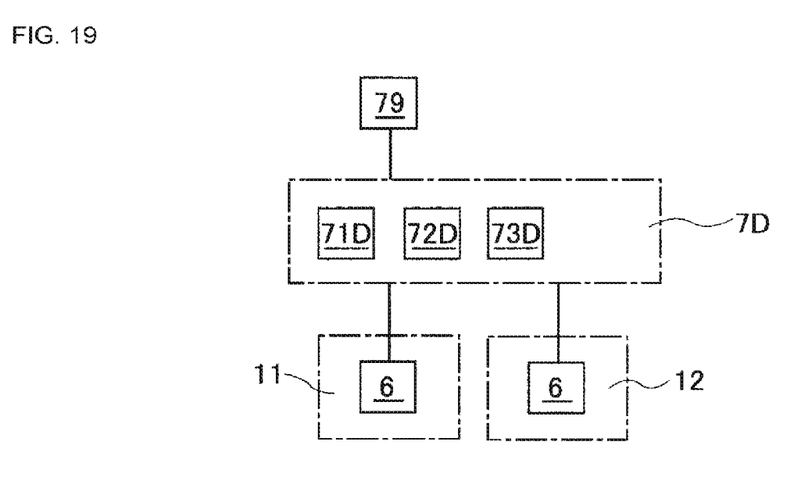
FIG. 19 A block diagram showing a functional configuration of a mounting order determination device of a fifth embodiment.

Next, mounting order determination device 7D of a fifth embodiment will be described with reference to FIG. 19 mainly with respect to points which differ from the first to fourth embodiments. FIG. 19 is a block diagram showing a functional configuration of mounting order determination device 7D of the fifth embodiment. In the fifth embodiment, mounting order determination device 7D is connected to control section 6 of first component mounting machine 11 and control section 6 of second component mounting machine 12. First component mounting machine 11 and second component mounting machine 12 share the board type. More specifically, first component mounting machine 11 sets a first group of board types including board type A and board type B as a target of the mounting work. Second component mounting machine 12 sets the second group of board types including board type C as a target of the mounting operation.

Level setting section 71D, component extracting section 72D, and order determination section 73D of mounting order determination device 7D of the fifth embodiment exhibit functions different from those of the first, third, and fourth embodiments. More specifically, level setting section 71D sets the first level information to be applied to first component mounting machine 11, and further sets the second level information to be applied to the second component mounting machine 12. The first level information matches the level information of the five component types shown in FIG. 9. The second level information matches the level information of the three component types shown in FIG. 17. The orders of the first level information and the second level information are different from each other.

The corresponding component extracting section 72D extracts a combination of multiple components corresponding to the multi-stacked mounting for the first group of board types. Further, the corresponding component extracting section 72D extracts a combination of multiple components corresponding to proximity mounting for the board type of the second group. Order determination section 73D selectively uses the first level information and the second level information in accordance with the distinction between first component mounting machine 11 and second component mounting machine 12 that perform the mounting operation. More specifically, order determination section 73D uses the first level information when creating job data of board type A and board type B to be produced by first component mounting machine 11. Order determination section 73D uses the second level information when creating job data of board type C to be produced by second component mounting machine 12.

With this configuration, even if there is a combination of components in which the sequence of the mounting order is changed depending on the board type, the first level information and the second level information are selectively used in accordance with the difference between first component mounting machine 11 and second component mounting machine 12, among which the board types are divided. Therefore, mounting order determination device 7D can determine the correct mounting order for all board types.

7. Applications and Modifications of Embodiments

In each embodiment, the lowest-number level can be set for a component type which does not belong to the multilayer mounting component type group or the close-proximity mounting component type group. The lowest-number level corresponds to being mounted directly on board K. As a result, it is possible to handle all the component types collectively without having to be aware of the component type group. In the fourth and fifth embodiments, the board type of the first group has multilayer mounting and the board type of the second group has close-proximity mounting, but the present disclosure is not limited thereto. That is, it is also possible to handle a case in which all of multiple groups have multilayer mountings, or a case in which all of multiple groups have close-proximity mountings. In addition, in situations where the same level information is set in multiple component types, any component type for which the same value is set may be mounted first.

Further, job database 78 and order examination section 74 are added to mounting order determination device (7B, 7C, 7D) of the third to fifth embodiments in order to form the mounting order examination device. Mounting order determination devices (7, 7B, 7C, 7D) of the first and third to fifth embodiments can be implemented as mounting order determination methods. Mounting order examination device 7A of the second embodiment can also be implemented as a mounting order examination method. Various other applications and modifications are possible in the first to fifth embodiments.

REFERENCE SIGNS LIST

1: Component mounting machine, 11: First component mounting machine, 12: Second component mounting machine, 2: Board conveyance device, 3: Component supply device, 31: Feeder device, 4: Component transfer device, 5: Part camera, 6: Control section, 7, 7B, 7C, 7D: Mounting order determination device, 7A: Mounting Order checking device, 71, 71B, 71C, 71D: Level setting section, 72, 72B, 72C, 72D: Component extracting section, 73, 73B, 73C, 73D: Order determination section, 74: Order examination section, 78: Job database, 79: CAD database, K, KA, KB, KC: Board, PA: CPU component, PB: Small chip component, PC: Chip component, PD: Memory Component, PE: Shield component, HB, HC, HD: Height

The invention claimed is:

1. A mounting order determination device configured to determine a mounting order of multiple electronic components prior to mounting work of mounting multiple electronic components at respective mounting positions on a board by using a component mounting machine or a component mounting line configured by arranging multiple component mounting machines in a row, the mounting order determination device comprising:
   circuitry configured to
      set level information for each component type, in which mounting order priorities are ranked, each component type belonging to at least one of a multilayer mounting component type group that includes a component type of multiple electronic components having a possibility of being mounted in an up-down direction in layers, and a close-proximity mounting component type group that includes a component type of multiple electronic components for which the mounting order is restricted due to having a possibility of being mounted close to each other, the level information for the multilayer mounting component type group being set such that low-number levels are set to component types likely to be mounted as a lower side component of the multilayer mounting, and high-number levels are set to component types likely to be mounted as upper side components of the multilayer mounting, and the level information for the close-proximity mounting component type group being set such that low-number levels are set to component types having a small height, and high-number levels are set to component types having a large height;
      obtain information of a type of the board on the which the multiple electronic components are to be mounted, and dimensions of the multiple electronic components to be mounted;
      extract a combination of multiple electronic components to which at least one of multilayer mounting and close-proximity mounting is applied, based on the dimensions of the multiple electronic components, and mounting positions of the multiple electronic components based on the type of the board; and
      determine the mounting order of the electronic components in the combination based on the level information set for the component types of the electronic components included in the extracted combination.

2. The mounting order determination device of claim 1, wherein
the circuitry is configured to
   extract the combination of the multiple electronic components to which multilayer mounting is applied; and
   determine the mounting order for levels, in ascending order, set for component types of the electronic components included in the combination.

3. The mounting order determination device of claim 1, wherein
the circuitry is configured to
   extract the combination of the multiple electronic components to which close-proximity mounting is applied; and
   determine the mounting order for levels, in ascending order, set for component types of the electronic components included in the combination.

4. The mounting order determination device of claim 1, wherein
the circuitry is configured to
   set first level information, which is level information to be applied to a first group board type of the board, and further set second level information, which is level information to be applied to a second group board type of the board that is different from the first group board type, the second level information being different from the first level information; and
   selectively use the first level information and the second level information depending on the board type of the board to be mounted.

5. The mounting order determination device of claim 1, wherein
the circuitry is configured to
   set first level information, which is the level information to be applied to the first component mounting machine, the mounting work target of which is the first group board type, or the first component mounting line; and
   set second level information, which is the level information to be applied to the second component mounting machine, the mounting work target of which is the second group board type that is different from the first group, or the second component mounting line, and is level information different from the first level information; and
   selectively use the first level information and the second level information depending on the component mounting machine or the component mounting line that performs the mounting work.

6. A mounting order examination device configured to examine a mounting order, set in advance, of multiple electronic components prior to mounting work of mounting multiple electronic components at respective mounting positions on a board by using a component mounting machine or a component mounting line configured by arranging multiple component mounting machines in a row, the mounting order examination device comprising:
   circuitry configured to
      set level information for each component type, in which mounting order priorities are ranked, each component type belonging to at least one of a multilayer mounting component type group that includes a component type of multiple electronic components having a possibility of being mounted in an up-down direction in layers, and a close-proximity mounting component type group that includes a component type of multiple electronic components for which the mounting order is restricted due to having a possibility of being mounted close to each other, the level information for the multilayer mounting component type group being set such that low-number levels are set to component types likely to be mounted as a lower side component of the multilayer mounting, and high-number levels are set to component types likely to be mounted as upper side components of the multilayer mounting, and the level information for the close-proximity mounting component type group being set such that low-number levels are set to component types having a small height, and high-number levels are set to component types having a large height;
      obtain information of a type of the board on the which the multiple electronic components are to be mounted, and dimensions of the multiple electronic components to be mounted;
      extract a combination of multiple electronic components to which at least one of multilayer mounting and close-proximity mounting is applied, based on the dimensions of the multiple electronic components, and mounting positions of the multiple electronic components based on the type of the board;

determine a correct mounting order of the electronic components in the combination based on the level information set for the component types of the electronic components included in the extracted combination; and perform an examination by comparing a predetermined mounting order with the correct mounting order.

7. A mounting order determination method for determining a mounting order of multiple electronic components prior to mounting work of mounting multiple electronic components at respective mounting positions on a board by using a component mounting machine or a component mounting line configured by arranging multiple component mounting machines in a row, the mounting order determination method comprising:

setting level information for each component type, in which mounting order priorities are ranked, each component type belonging to at least one of a multilayer mounting component type group that includes a component type of multiple electronic components having a possibility of being mounted in an up-down direction in layers, and a close-proximity mounting component type group that includes a component type of multiple electronic components for which the mounting order is restricted due to having a possibility of being mounted close to each other, the level information for the multilayer mounting component type group being set such that low-number levels are set to component types likely to be mounted as a lower side component of the multilayer mounting, and high-number levels are set to component types likely to be mounted as upper side components of the multilayer mounting, and the level information for the close-proximity mounting component type group being set such that low-number levels are set to component types having a small height, and high-number levels are set to component types having a large height;

obtaining information of a type of the board on the which the multiple electronic components are to be mounted, and dimensions of the multiple electronic components to be mounted;

extracting a combination of multiple electronic components to which at least one of multilayer mounting and close-proximity mounting is applied, based on the dimensions of the multiple electronic components, and mounting positions of the multiple electronic components based on the type of the board; and determining the mounting order of the electronic components in the combination based on the level information set for the component types of the electronic components included in the extracted combination.

8. A mounting order examination method for examining a mounting order, set in advance, of multiple electronic components prior to mounting work to mount multiple electronic components at respective mounting positions on a board by using a component mounting machine or a component mounting line configured by arranging multiple component mounting machines in a row, the mounting order examination method comprising:

setting level information for each component type, in which mounting order priorities are ranked, each component type belonging to at least one of a multilayer mounting component type group that includes a component type of multiple electronic components having a possibility of being mounted in an up-down direction in layers, and a close-proximity mounting component type group that includes a component type of multiple electronic components for which the mounting order is restricted due to having a possibility of being mounted close to each other, the level information for the multilayer mounting component type group being set such that low-number levels are set to component types likely to be mounted as a lower side component of the multilayer mounting, and high-number levels are set to component types likely to be mounted as upper side components of the multilayer mounting, and the level information for the close-proximity mounting component type group being set such that low-number levels are set to component types having a small height, and high-number levels are set to component types having a large height;

obtaining information of a type of the board on the which the multiple electronic components are to be mounted, and dimensions of the multiple electronic components to be mounted;

extracting a combination of multiple electronic components to which at least one of multilayer mounting and close-proximity mounting is applied, based on the dimensions of the multiple electronic components, and mounting positions of the multiple electronic components based on the type of the board;

determining a correct mounting order of the electronic components in the combination based on the level information set for the component types of the electronic components included in the extracted combination; and performing an examination by comparing a predetermined mounting order with the correct mounting order.

* * * * *